(12) United States Patent
Kuo et al.

(10) Patent No.: US 9,711,473 B1
(45) Date of Patent: Jul. 18, 2017

(54) SEMICONDUCTOR DIE, SEMICONDUCTOR WAFER AND METHOD FOR MANUFACTURING THE SAME

(71) Applicant: Advanced Semiconductor Engineering, Inc., Kaohsiung (TW)

(72) Inventors: Chin-Cheng Kuo, Kaohsiung (TW); Ying-Te Ou, Kaohsiung (TW); Lu-Ming Lai, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/054,502

(22) Filed: Feb. 26, 2016

(51) Int. Cl.
| | |
|---|---|
| *H01L 23/28* | (2006.01) |
| *H01L 23/00* | (2006.01) |
| *H01L 23/528* | (2006.01) |
| *H01L 23/522* | (2006.01) |
| *H01L 21/768* | (2006.01) |
| *H01L 21/78* | (2006.01) |

(52) U.S. Cl.
CPC ........ *H01L 24/13* (2013.01); *H01L 21/76802* (2013.01); *H01L 21/76831* (2013.01); *H01L 21/76877* (2013.01); *H01L 21/78* (2013.01); *H01L 23/528* (2013.01); *H01L 23/5226* (2013.01); *H01L 24/11* (2013.01); *H01L 24/94* (2013.01); *H01L 2224/13024* (2013.01)

(58) Field of Classification Search
CPC ............ H01L 2224/94; H01L 2224/11; H01L 2224/03; H01L 2924/12042; H01L 2924/00
See application file for complete search history.

(56) References Cited

U.S. PATENT DOCUMENTS

| | | | | |
|---|---|---|---|---|
| 5,899,729 | A * | 5/1999 | Lee | .......................... H01L 21/78 257/E21.599 |
| 2006/0068567 | A1 * | 3/2006 | Beyne | ..................... H01L 21/78 438/460 |
| 2010/0096730 | A1 | 4/2010 | Stacey | |
| 2016/0071779 | A1 * | 3/2016 | Chen | ....................... H01L 24/97 257/787 |

* cited by examiner

*Primary Examiner* — Roy Potter
(74) *Attorney, Agent, or Firm* — Foley & Lardner LLP; Cliff Z. Liu

(57) ABSTRACT

A semiconductor die includes a semiconductor body, an insulating layer, a conductive circuit layer and at least one conductive bump. The semiconductor body has a first surface, a second surface and a side surface extending between the first surface and the second surface. The insulating layer is disposed on the first surface and the side surface of the semiconductor body. The insulating layer includes a first insulating layer over the semiconductor body and a second insulating layer over the first insulating later. The insulating layer includes a step structure. The conductive circuit layer is electrically connected to the first surface of the semiconductor body, the conductive circuit layer includes at least one pad, and the conductive bump is electrically connected to the pad.

19 Claims, 8 Drawing Sheets

SEMICONDUCTOR DIE, SEMICONDUCTOR WAFER AND METHOD FOR MANUFACTURING THE SAME

BACKGROUND

1. Technical Field

The present disclosure relates to a semiconductor die, semiconductor wafer and method for manufacturing the same. In particular, the present disclosure relates to a semiconductor die including a step structure and method for manufacturing the same.

2. Description of the Related Art

When manufacturing a semiconductor wafer level package, a substrate wafer may be separated into individual dice in a singulation process. The singulation may be performed using a blade. During singulation, stress can occur on a side surface of a die, especially at a corner of the die (which is sometimes referred to as a "stress concentration effect"). Such stress can cause damage to a protection layer of the die, resulting, for example, in a crack at an edge or a corner of a singulated die.

SUMMARY

In an aspect, a semiconductor die includes a semiconductor body, an insulating layer, a conductive circuit layer and at least one conductive bump. The semiconductor body has a first surface, a second surface and a side surface extending between the first surface and the second surface. The insulating layer is disposed on the first surface and the side surface of the semiconductor body. The insulating layer includes a first insulating layer over the semiconductor body and a second insulating layer over the first insulating later. The insulating layer includes a step structure. The conductive circuit layer is electrically connected to the first surface of the semiconductor body, the conductive circuit layer includes at least one pad, and the conductive bump is electrically connected to the pad.

In an aspect, a semiconductor die includes a semiconductor body, an insulating layer, a conductive circuit layer, and a conductive bump. The semiconductor body includes a first surface, a second surface and a side surface extending between the first surface and the second surface. The insulating layer is disposed on the first surface, and includes a step structure. The conductive circuit layer is electrically connected to the first surface of the semiconductor body, and the conductive circuit layer includes a pad. The conductive bump electrically connects to the pad.

In an aspect, a semiconductor wafer includes a semiconductor body, an insulating layer, a conductive circuit layer and at least one conductive bump. The semiconductor body defines at least one trench recessed from a first surface of the semiconductor body. The insulating layer is disposed on the first surface of the semiconductor body and on a side surface of the trench. The insulating layer defines at least one groove in the trench. The conductive circuit layer is electrically connected to the first surface of the semiconductor body, the conductive circuit layer includes at least one pad, and the conductive bump is electrically connected to the pad.

In an aspect, a semiconductor process includes (a) providing a semiconductor body having a first surface and a second surface opposite the first surface; (b) forming at least one trench on the first surface of the semiconductor body; (c) forming an insulating layer and a conductive circuit layer on the first surface of the semiconductor body, wherein the insulating layer extends onto a side surface of the trench to define at least one groove in the trench, and the conductive circuit layer is electrically connected to the first surface of the semiconductor body and includes at least one pad; and (d) forming at least one conductive bump to electrically connect to a respective pad.

DETAILED DESCRIPTION

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

A manufacturing process of making a semiconductor die may begin with forming a trench on a top surface of a semiconductor body by a first blade, followed by forming a protection layer on the top surface of a semiconductor body such that the trench is filled by the protection layer. Then, the semiconductor body may be thinned from a bottom surface such as by grinding so that the trench penetrates through the semiconductor body. A singulation process may then be performed using a second blade, where the second blade cuts through the protection layer in the trench so as to form multiple individual semiconductor dice. In such a process, the first blade is used to cut the semiconductor body (e.g., silicon), and the second blade is used to cut the protection layer (e.g., a polymer). Therefore, the first blade is different from the second blade, and time is spent to change blades. In addition, after a blade is changed, the blade generally should be realigned.

Additionally in the process described, using a protection layer in the trench of the semiconductor body, a coefficient of thermal expansion (CTE) of the protection layer does not match the CTE of the semiconductor body. For example, the CTE of the protection layer may be about 65 ppm/° C. (parts per million per degree Celsius), whereas the CTE of the semiconductor body may be about 2.6 ppm/° C. Therefore, before singulation, the protection layer filled into the trench can result in significant warpage, which can have a negative impact on subsequent stages of the process.

Further, a stress can occur on a side surface of a die where it is exposed to the second blade during singulation, and especially at a corner of the die (the stress concentration effect). Such stress can cause damage to the protection layer of the die, such as resulting in a crack of an edge or a corner of the singulated die.

To address the above concerns, a step structure and an arc-shaped corner are provided at a top edge of the protection layer of the dice before singulation according to embodiments of the present disclosure. The techniques described reduce stress (and stress concentration effect) so as to reduce a warpage of the semiconductor die.

Figure 1A:
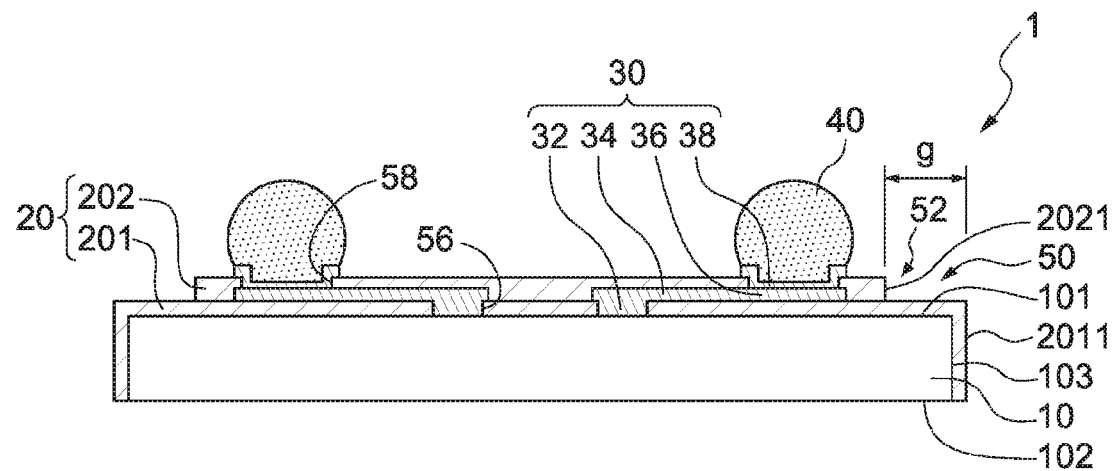
FIG. 1A illustrates a cross-sectional view of a semiconductor die in accordance with an embodiment of the present disclosure.

FIG. 1A is a cross-sectional view of a semiconductor die 1 in accordance with an embodiment of the present disclosure. The semiconductor die 1 includes a semiconductor body 10, an insulating layer 20, a conductive circuit layer 30 and one or more conductive bumps 40.

The semiconductor body 10 includes silicon. The semiconductor body 10 has a first surface 101, a second surface 102 opposite to the first surface 101 and a side surface 103 extending between the first surface 101 and the second surface 102.

The insulating layer 20 includes a first insulating layer 201 and a second insulating layer 202. The first insulating layer 201 is disposed on the first surface 101 and the side surface 103 of the semiconductor body 10. The first insulating layer 201 has a side surface 2011. The second insulating layer 202 is disposed on the first insulating layer 201, and has a side surface 2021.

The insulating layer 20 includes a step structure 52, which is defined by a difference in height between a top surface of the first insulating layer 201 and a top surface of the second insulating layer 202 (where "top surface" refers to the topmost surface in the orientation shown in FIG. 1A) and by a gap g between the side surface 2021 of the second insulating layer 202 and the side surface 2011 of the first insulating layer 201. Thus, the insulating layer 20 includes a notch portion 50 around a periphery of the insulating layer 20 to form the step structure 52. In other words, from a top view, an area of the second insulating layer 202 is smaller than an area of the first insulating layer 201, and the side surface 2021 of the second insulating layer 202 is set back by the gap g from the side surface 2011 of the first insulating layer 201 (e.g., the side surface 2021 of the second insulating layer 202 is not coplanar with the side surface 2011 of the first insulating layer 201).

The first insulating layer 201 and the second insulating layer 202 may include the same or similar materials, or may include different materials. In one or more embodiments, one or both of the first insulating layer 201 and the second insulating layer 202 includes a passivation material such as, for example, a photosensitive polymer. In one or more embodiments, a total thickness of the insulating layer 20 (thicknesses of the first insulating layer 201 and the second insulating layer 202 together) is in a range of about 13 micrometers (μm) to about 35 μm, such as about 13 μm to about 20 μm, about 15 μm to about 20 μm, or about 20 μm to about 35 μm.

The conductive circuit layer 30 is inside the insulating layer 20. The conductive circuit layer 30 is disposed over the first insulating layer 201 and contacts the first surface 101 of the semiconductor body 10, and the second insulating layer 202 is disposed over the first conductive layer 30 (and, as discussed above, over the first insulating layer 201). The conductive circuit layer 30 is electrically connected to the first surface 101 of the semiconductor body 10.

The conductive circuit layer 30 includes at least one conductive via 32, a patterned circuit layer 34, at least one pad 36 and at least one under-bump metallization (UBM) 38. The first insulating layer 201 defines at least one first opening 56. The conductive via 32 is disposed in the first opening 56 of the first insulating layer 201, and connects the patterned circuit layer 34 and the first surface 101 of the semiconductor body 10. The patterned circuit layer 34 includes the pad 36. That is, the pad 36 is a portion of the patterned circuit layer 34. The second insulating layer 202 defines at least one second opening 58 to expose the pad 36. The UBM 38 is disposed in the second opening 58 to connect to the pad 36. In one or more embodiments, one or more of the conductive via 32, the patterned circuit layer 34 and the pad 36 include copper (Cu), aluminum (Al), another suitable metal, or an alloy thereof. In one or more embodiments, the UBM 38 includes Cu, nickel (Ni), Al, titanium (Ti), another suitable metal, or an alloy thereof.

The conductive bump 40 is electrically connected to a respective pad 36, and is used for external connection. As shown in FIG. 1A, the conductive bump 40 is disposed on the respective UBM 38. In one or more embodiments, the conductive bump 40 may include tin (Sn), another suitable metal, or an alloy thereof.

Figure 1B:
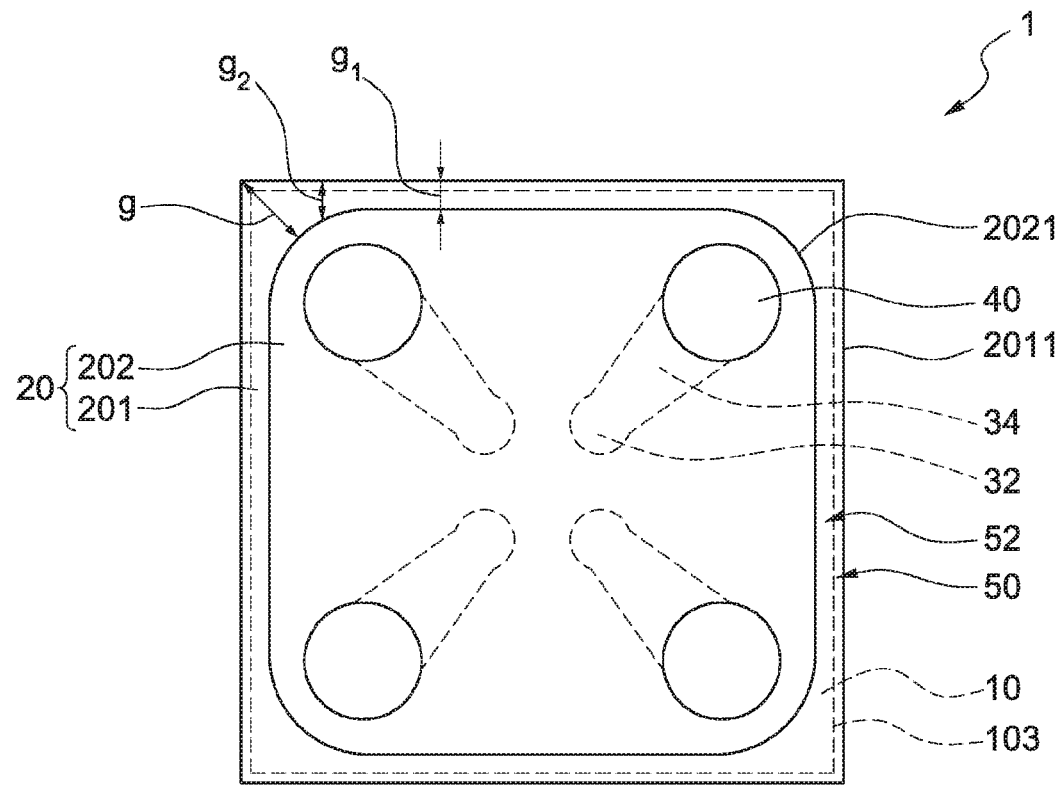
FIG. 1B illustrates a top view of the semiconductor device of FIG. 1A.

FIG. 1B illustrates a top view of the semiconductor die 1 of FIG. 1A. In the embodiment illustrated in FIG. 1B, each corner of the second insulating layer 202 is arcuate from the top view, whereas the first insulating layer 201 is rectangular from the top view. As discussed above, due to the gap g, the area of the second insulating layer 202 is smaller than the area of the first insulating layer 201. The gap g extends fully around the semiconductor die 1. Along the sides of the semiconductor 1, the side surface 2021 of the second insulating layer 202 is substantially parallel with the side surface 2011 of the first insulating layer 201, with a gap $g_1$ therebetween. At the corners of the semiconductor die 1 (at the arcuate portion of the second insulating layer 202), the side surface 2021 of the second insulating layer 202 and the side surface 2011 of the first insulating layer 201 are not parallel, and a gap $g_2$ therebetween varies with the curvature of the arcuate portion of the second insulating layer 202. Thus, the gap g between the side surface 2021 of the second insulating layer 202 and the side surface 2011 of the first insulating layer 201 is not uniform (the width of the notch portion 50 is not uniform). That is, $g_1$ is not equal to $g_2$, and the gap $g_2$ at the corners of the semiconductor die 1 is greater than about $(\sqrt{2})(g_1)$.

In the embodiment illustrated in FIG. 1A and FIG. 1B, the first insulating layer 201 on the side surface 103 of the semiconductor body 10 is a protection layer for protecting the semiconductor body 10 from corrosion or moisture. A reliability of the semiconductor die 1 can thus be improved. In addition, the step structure 52 and arcuate corners of the second insulating layer 202 may reduce the stress concentration effect, and thus reduce warpage or cracking of the semiconductor die 1.

Figure 2A:
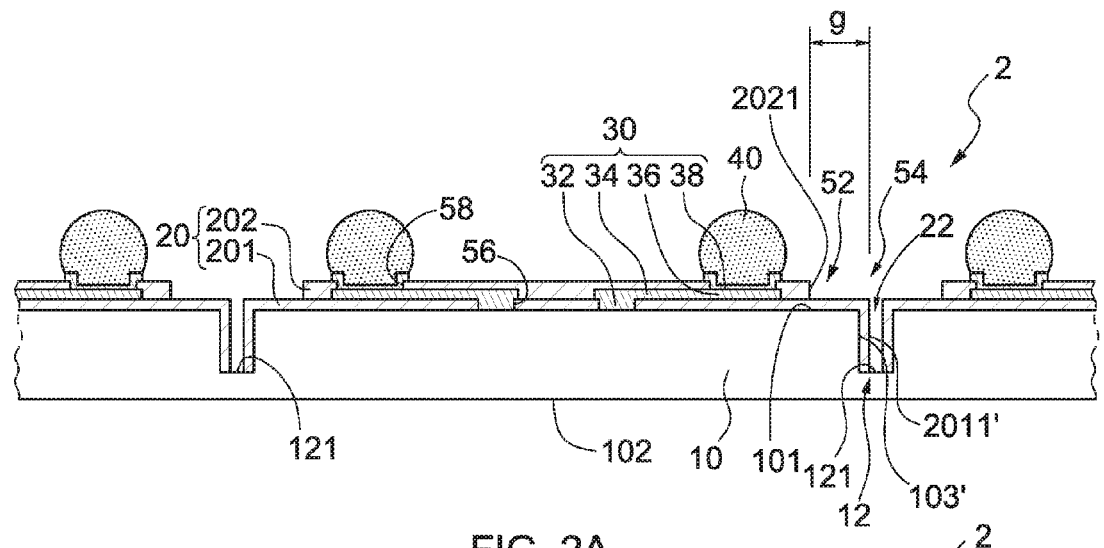
FIG. 2A illustrates a cross-sectional view of a semiconductor wafer in accordance with an embodiment of the present disclosure.

FIG. 2A is a cross-sectional view of a semiconductor wafer 2 in accordance with an embodiment of the present disclosure. The semiconductor wafer 2 is shown prior to singulation. The semiconductor wafer 2 includes a semiconductor body 10, an insulating layer 20, a conductive circuit layer 30 and at least one conductive bump 40.

The semiconductor body 10 has a first surface 101, a second surface 102 opposite to the first surface 101 and at least one trench 12 recessed from the first surface 101 of the semiconductor body 10. The trench 12 does not penetrate through the semiconductor body 10, and is defined by two side surfaces 103' and a bottom surface 121.

The insulating layer 20 includes a first insulating layer 201 and a second insulating layer 202. The first insulating layer 201 is disposed on the first surface 101 and the side surfaces 103' of the trench 12. The first insulating layer 201 has a side surface 2011'. The second insulating layer 202 is disposed on the first insulating layer 201, and has a side surface 2021.

The insulating layer 20 includes a step structure 52, which is defined by a difference in height between a top surface of the first insulating layer 201 and a top surface of the second insulating layer 202 (where "top surface" refers to the topmost surface in the orientation shown in FIG. 2A) and by a gap g between the side surface 2021 of the second insulating layer 202 and the side surface 2011' of the first insulating layer 201. In other words, from a top view, an area of the second insulating layer 202 is smaller than an area of the first insulating layer 201, and the side surface 2021 of the second insulating layer 202 is set back by the gap g from the side surface 2011' of the first insulating layer 201 (e.g., the side surface 2021 of the second insulating layer 202 is not coplanar with the side surface 2011' of the first insulating layer 201).

The first insulating layer 201 defines at least one groove 22 in the trench 12. That is, the first insulating layer 201 does not fill the trench 12. Further, the insulating layer 20 does not fully cover the bottom surface 121 of the trench 12 in the embodiment of FIG. 2A; thus, the bottom surface 121 of the trench 12 is exposed.

The second insulating layer 202 defines at least one trough 54, and each trough 54 extends between the side surfaces 2021 of adjacent die units (see FIG. 2B) that will become individual dice after singulation. The trough 54 is wider than the groove 22 and the trench 12.

The first insulating layer 201 and the second insulating layer 202 may include the same or similar materials, or may include different materials. In one or more embodiments, one or both of the first insulating layer 201 and the second insulating layer 202 includes a passivation material such as, for example, a photosensitive polymer. In one or more embodiments, a total thickness of the insulating layer 20 (thicknesses of the first insulating layer 201 and the second insulating layer 202 together) is in a range of about 13 μm to about 35 μm, such as about 13 μm to about 20 μm, about 15 μm to about 20 μm, or about 20 μm to about 35 μm.

The conductive circuit layer 30 is inside the insulating layer 20. The conductive circuit layer 30 is disposed over the first insulating layer 201 and contacts the first surface 101 of the semiconductor body 10, and the second insulating layer 202 is disposed over the first conductive layer 30 (and, as discussed above, over the first insulating layer 201). The conductive circuit layer 30 is electrically connected to the first surface 101 of the semiconductor body 10.

The conductive circuit layer 30 includes at least one conductive via 32, a patterned circuit layer 34, at least one pad 36 and at least one UBM 38. The first insulating layer 201 defines at least one first opening 56. The conductive via 32 is disposed in the first opening 56 of the first insulating layer 201, and connects the patterned circuit layer 34 and the first surface 101 of the semiconductor body 10. The patterned circuit layer 34 includes the pad 36. That is, the pad 36 is a portion of the patterned circuit layer 34. The second insulating layer 202 defines at least one second opening 58 to expose the pad 36. The UBM 38 is disposed in the second opening 58 to connect to the pad 36. In one or more embodiments, one or more of the conductive via 32, the patterned circuit layer 34 and the pad 36 include Cu, Al, another suitable metal, or an alloy thereof. In one or more embodiments, the UBM 38 includes Cu, Ni, Al, Ti, another suitable metal, or an alloy thereof.

The conductive bump 40 is electrically connected to a respective pad 36, and is used for external connection. As shown in FIG. 2A, the conductive bump 40 is disposed on the respective UBM 38. In one or more embodiments, the conductive bump 40 may include Sn, another suitable metal, or an alloy thereof.

Figure 2B:
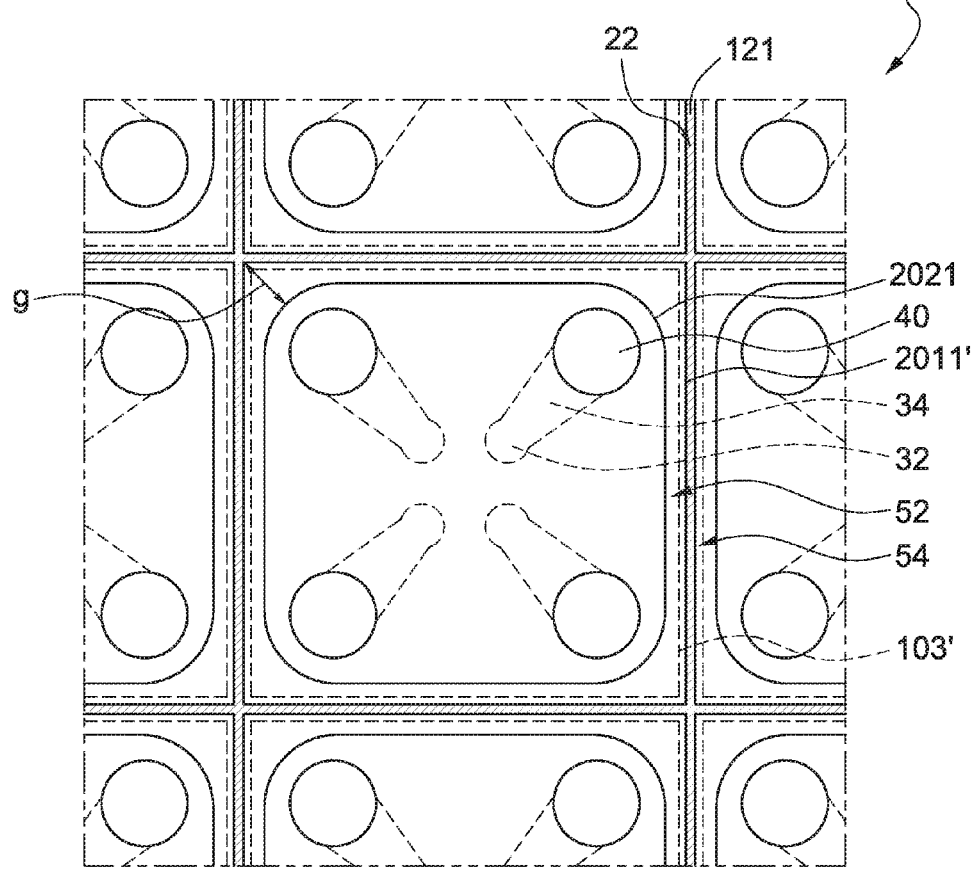
FIG. 2B illustrates a top view of the semiconductor wafer of FIG. 2A.

FIG. 2B shows a top view of the semiconductor wafer 2 of FIG. 2A. The groove 22 defines boundaries of multiple die units which will be individual dice after singulation. The die unit is, for example, the semiconductor die 1 of FIG. 1A and FIG. 1B after singulation. As described with respect to the semiconductor die 1 FIG. 1A and FIG. 1B, each corner of the second insulating layer 202 is arcuate from the top view, whereas the first insulating layer 201 is rectangular from the top view; thus the gap g between the side surface 2021 of the second insulating layer 202 and the side surface 2011' of the first insulating layer 201 is not uniform. That is, a width of the trough 54 is not uniform.

FIGS. 3A-3G illustrate a semiconductor process according to an embodiment of the present disclosure.

Figure 3A:
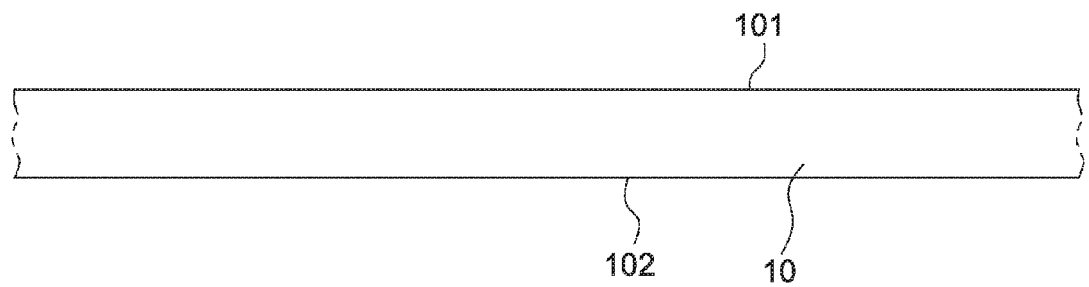
FIG. 3A, FIG. 3B, FIG. 3C, FIG. 3D, FIG. 3E, FIG. 3F and FIG. 3G illustrate a semiconductor process according to an embodiment of the present disclosure.

Referring to FIG. 3A, a semiconductor body 10 is provided, and the semiconductor body 10 has a first surface 101 and a second surface 102 opposite to the first surface 101. In one or more embodiments, a thickness of the semiconductor body 10 is in a range of about 100 μm to about 750 μm, or about 250 μm to about 300 μm. In one or more embodiments, the semiconductor body 10 includes silicon.

Figure 3B:
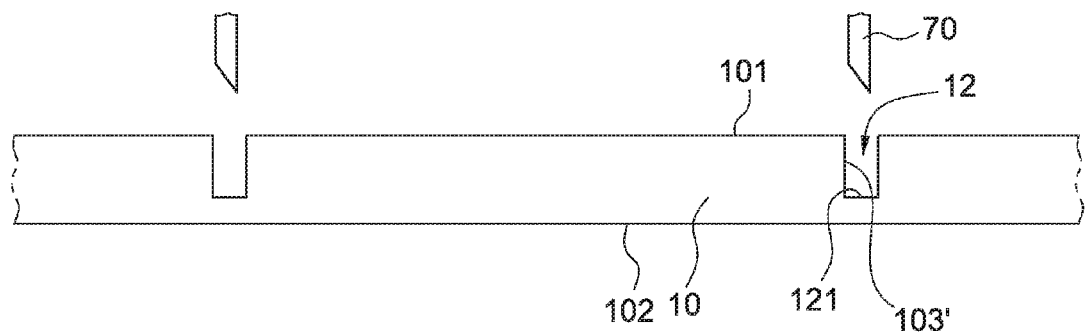

Referring to FIG. 3B, at least one trench 12 is formed from the first surface 101 of the semiconductor body 10. The trench 12 does not penetrate through the semiconductor body 10. The trench 12 is defined by two side surfaces 103' and a bottom surface 121. In the embodiment illustrated, the trench 12 is formed by sawing the semiconductor body 10 using a blade 70.

Figure 3C:
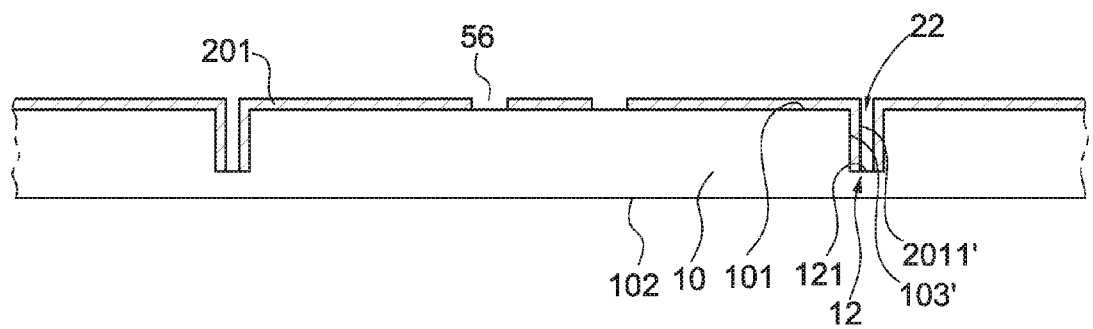

Referring to FIG. 3C, a first insulating layer 201 is formed on the first surface 101 of the semiconductor body 10 and on the side surfaces 103' of the trench 12. The first insulating layer 201 has side surfaces 2011' in the trench 12, which define a groove 22. The first insulating layer 201 extends into the trench 12; however, the first insulating layer 201 does not completely fill the trench 12, and does not fully cover the bottom surface 121 of the trench 12. Because the first insulating layer 201 does not completely fill the trench 12, a mismatch of the CTE between the first insulating layer 201 and the semiconductor body 10 will not result in warpage of the semiconductor body 10.

At least one first opening 56 is formed in the first insulating layer 201, such as by a lithography technique. The first opening 56 exposes a portion of the first surface 101 of the semiconductor body 10.

In one or more embodiments, the first insulating layer 201 is a passivation material (e.g., a photosensitive polymer), and is formed by laminating a film structure. In one or more embodiments, a thickness of the first insulating layer 201 is in a range of about 5.5 μm to about 17 μm, such as about 5.5 μm to about 10 μm, or about 5.5 μm to about 13 μm.

Figure 3D:
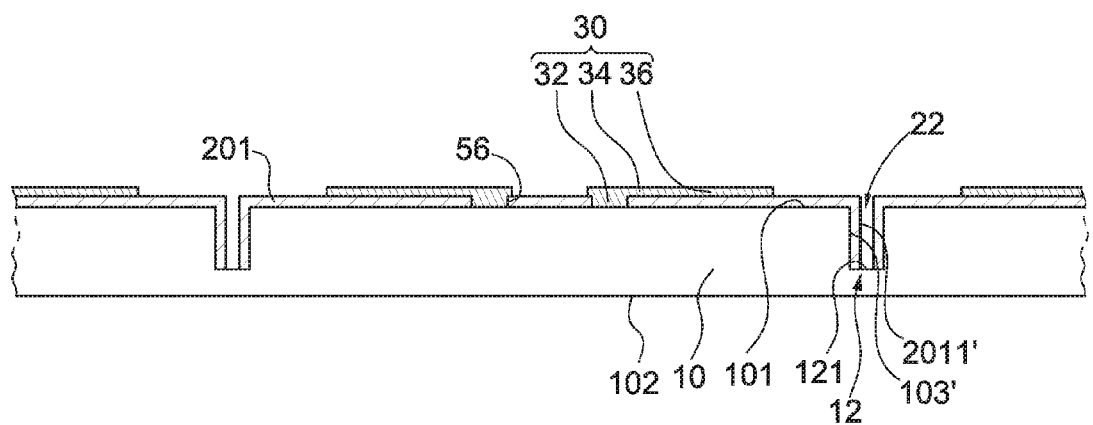

Referring to FIG. 3D, a patterned circuit layer 34 and at least one conductive via 32 are formed. The patterned circuit layer 34 includes a pad 36. The patterned circuit layer 34 is disposed on the first insulating layer 201. The conductive via 32 is disposed in the first opening 56 of the first insulating layer 201 to connect the patterned circuit layer 34 and the first surface 101 of the semiconductor body 10. In one or more embodiments, a metal (e.g., Cu, Al, another suitable metal, or an alloy thereof) is plated in the first opening 56 to form the conductive via 32, and is further plated on the first insulating layer 201 in a pattern (or is subsequently patterned) to form the patterned circuit layer 34.

Figure 3E:
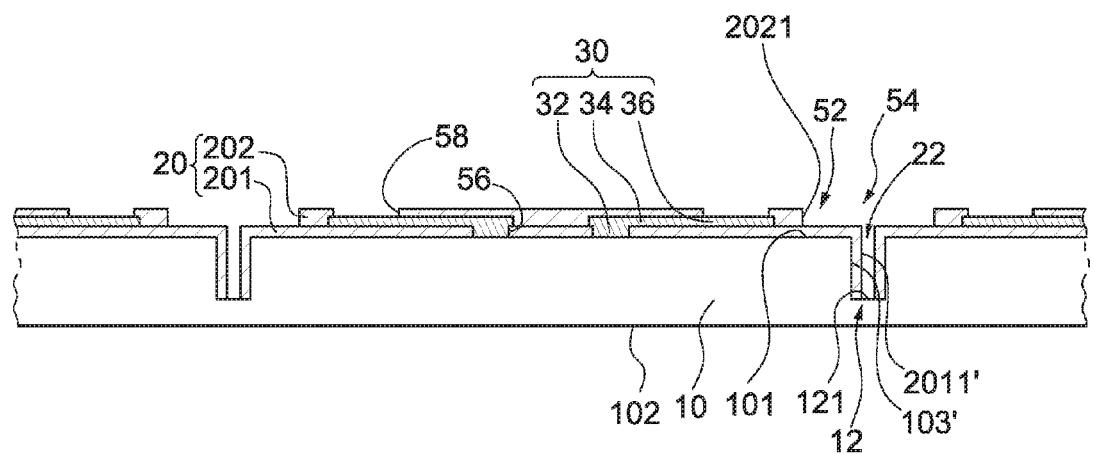

Referring to FIG. 3E, a second insulating layer 202 is formed on the first insulating layer 201 to cover the patterned circuit layer 34, the conductive via 32 and the first insulating layer 201. In one or more embodiments, the second insulating layer 202 is a passivation material (e.g., a photosensitive polymer), and is formed by laminating a film structure. The second insulating layer 202 and the first insulating layer 201 may include the same or similar materials, or may include different materials.

At least one second opening 58 and at least one trough 54 are formed in the second insulating layer 202, such as by a lithography technique. The trough 54 exposes the groove 22 and the second opening 58 exposes the pad 36. The trough 54 surrounds the second insulating layer 202 around a periphery of a die unit to form a step structure 52 on the die unit. A width of the trough 54 is greater than a width of the groove 22. The second insulating layer 202 and the first insulating layer 201 together form an insulating layer 20.

Figure 3F:
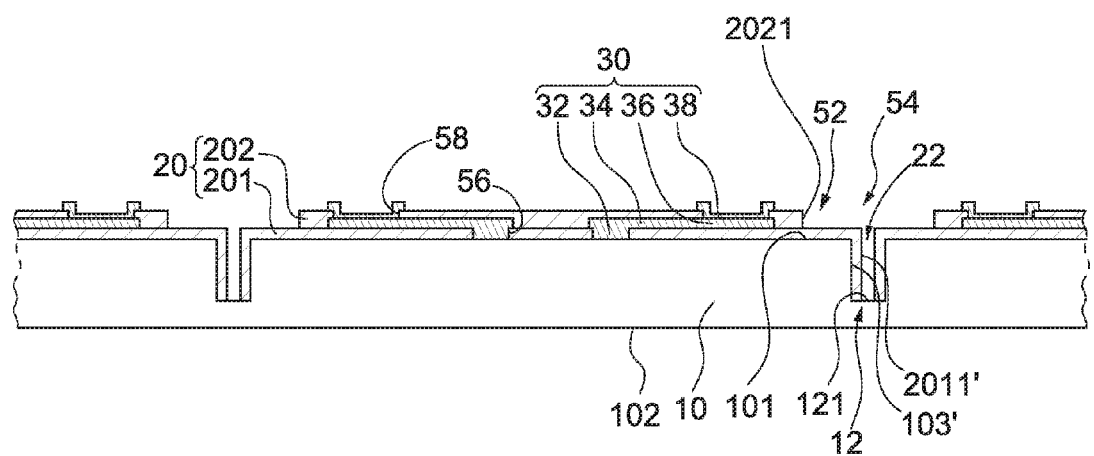

Referring to FIG. 3F, at least one UBM 38 is formed on the pad 36 in the second opening 58 of the second insulating layer 202. The UBM 38 may include Cu, Ni, Al, Ti, another suitable metal, or an alloy thereof. The conductive via 32, the patterned circuit layer 34, the pad 36 and the UBM 38 together form a conductive circuit layer 30.

Figure 3G:
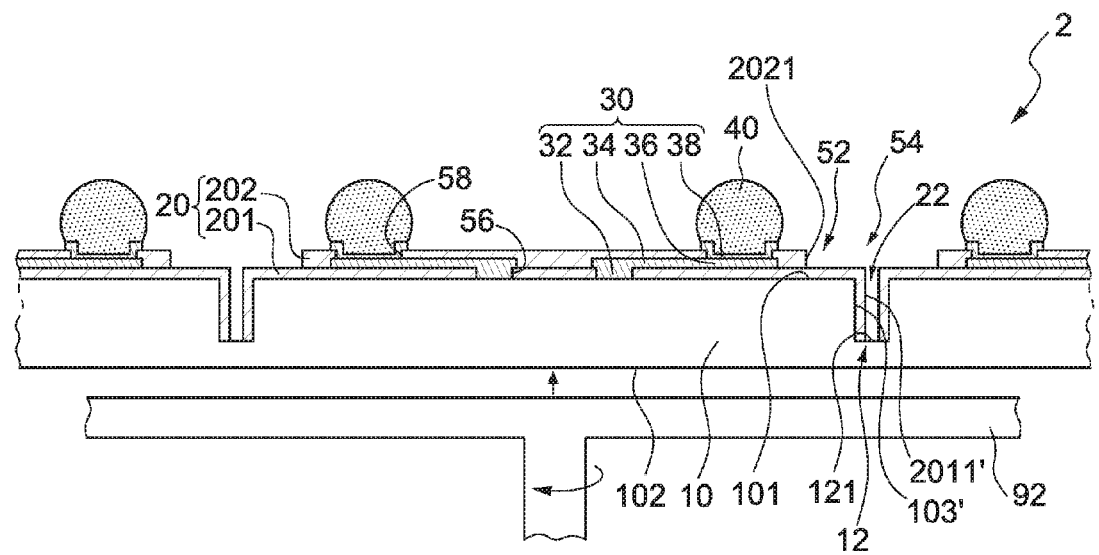

Referring to FIG. 3G, at least one conductive bump 40 is formed on the at least one UBM 38 to obtain the semiconductor wafer 2 as shown in FIG. 2A and FIG. 2B. Each conductive bump 40 is electrically connected to the respective UBM 38. In one or more embodiments, the conductive bump 40 includes Sn, another suitable metal, or an alloy thereof.

Then, a portion of the semiconductor body 10 is removed from the second surface 102 of the semiconductor body 10, such as by backside grinding, until the groove 22 penetrates fully through the semiconductor body 10 such that the die units are singulated, to form individual semiconductor dice 1 as shown in FIG. 1A and FIG. 1B. In the embodiment illustrated in FIG. 3G, the backside grinding is performed by using a rotatable polishing pad 92.

In the embodiment of FIGS. 3A-3G, a single blade 70 is used, to perform sawing (FIG. 3B). Thus, an additional blade is not needed, no blade change is needed, time to change the blade is avoided, and time to realign the blade after a blade change is avoided. Additionally, the die units of the semiconductor wafer 2 are separated at one stage to form the semiconductor die 1 (FIG. 3G). Accordingly, manufacturing time is shortened, and a production units per hour (UPH) metric is increased. For example, for an eight inch wafer with 25,000 die units, the manufacturing time for one wafer is shortened by 2.5 hours using the manufacturing processes of FIGS. 3A-3G, as compared to two stages of sawing.

Figure 4A:
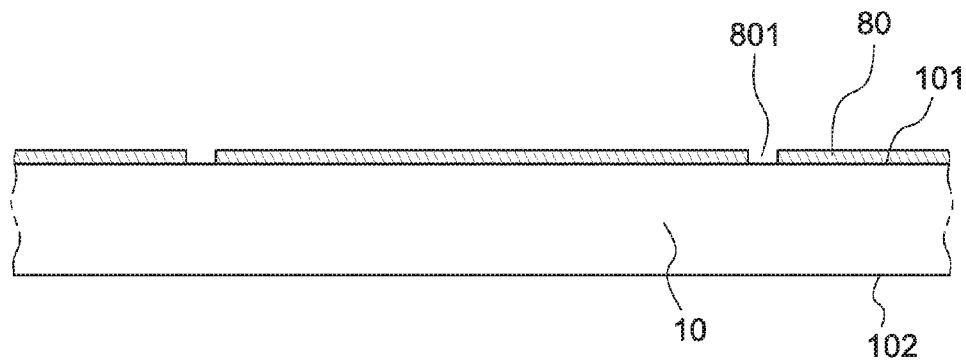
FIG. 4A, FIG. 4B and FIG. 4C illustrate a semiconductor process according to an embodiment of the present disclosure.
Figure 4B:
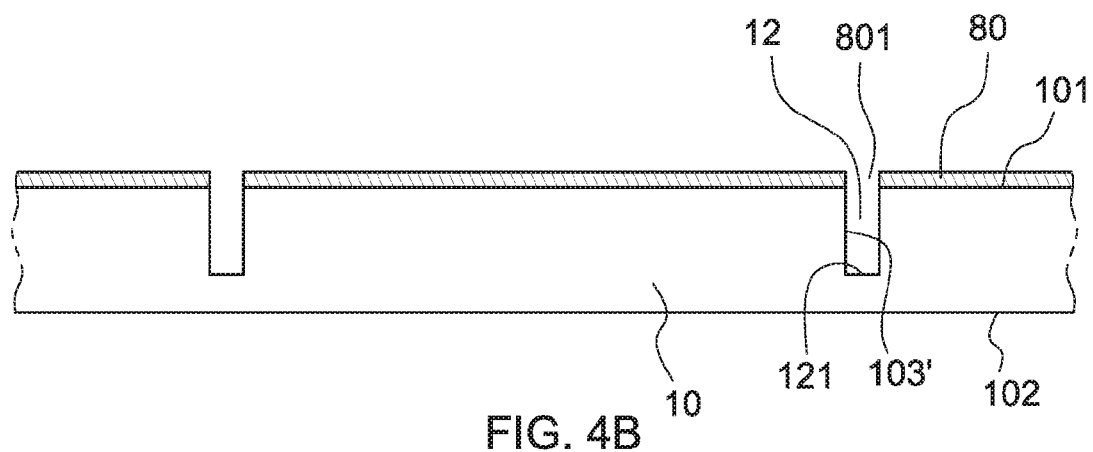
Figure 4C:
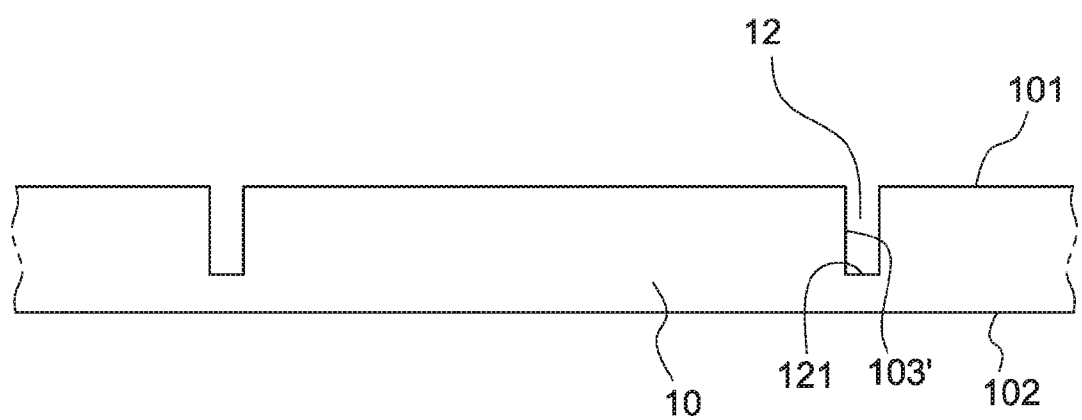

FIGS. 4A-4C illustrate a semiconductor process according to an embodiment of the present disclosure. The initial stage of this embodiment is the same as shown in FIG. 3A, and the stage of FIG. 4A is subsequent to the stage of FIG. 3A.

Referring to FIG. 4A, a photoresist layer 80 is applied on the first surface 101 of the semiconductor body 10. Then, a portion of the photoresist layer 80 is removed to form at least one photoresist layer opening 801 to expose the first surface 101 of the semiconductor body 10.

Referring to FIG. 4B, the semiconductor body 10 is etched through the photoresist layer opening 801 to form the trench 12. The manufacturing stages of FIGS. 4A and 4B avoid using a blade, including avoiding a difficulty in selecting a blade and alignment of the blade. Therefore, the etching operation of FIGS. 4A and 4B may improve trench formation accuracy.

Referring to FIG. 4C, the photoresist layer 80 is removed. Then, the stages of FIG. 3C to FIG. 3G are performed subsequent to the stage of FIG. 4C to obtain semiconductor dice such as the semiconductor die 1 shown in FIG. 1A and FIG. 1B.

Figure 5:
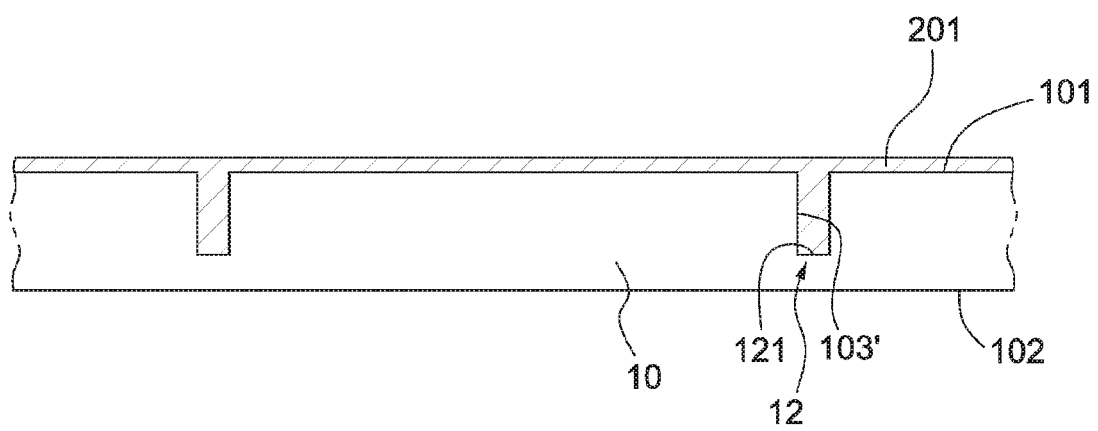
FIG. 5 illustrates a semiconductor process according to an embodiment of the present disclosure.

FIG. 5 illustrates a semiconductor process according to an embodiment of the present disclosure. The initial stages of this embodiment are the same as shown in FIG. 3A and FIG. 3B, and the stage of FIG. 5 is subsequent to the stage of FIG. 3B. As shown in FIG. 5, a first insulating layer 201 is formed to cover the first surface 101 of the semiconductor body 10 and to completely fill the trench 12. Then, a portion of the first insulating layer 201 is removed (e.g., by a lithography technique) to obtain the device illustrated in FIG. 3C. Specifically, a portion of the first insulating layer 201 in the trench 12 is removed to form the groove 22, and a portion of the first insulating layer 201 on the first surface 101 of the semiconductor body 10 is removed to form the first opening 56. Then, the stages of FIG. 3D to FIG. 3G subsequent to the stage of FIG. 5 are performed to obtain semiconductor dice such as the semiconductor die 1 shown in FIG. 1A and FIG. 1B.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

For another example, the term "substantially parallel" with respect to two edges or surfaces can refer to lying along a line or along a plane, with an angular displacement between the two edges or surfaces being less than or equal to 10°, such as less than or equal to 5°, less than or equal to 3°, less than or equal to 2°, or less than or equal to 1°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor die, comprising:
    a semiconductor body having a first surface, a second surface and a side surface extending between the first surface and the second surface;
    an insulating layer disposed on the first surface and the side surface of the semiconductor body, the insulating layer comprising a first insulating layer over the semiconductor body and a second insulating layer over the first insulating later, the insulating layer including a step structure;
    a conductive circuit layer electrically connected to the first surface of the semiconductor body, the conductive circuit layer comprising at least one pad; and
    at least one conductive bump electrically connected to a respective pad.

2. The semiconductor die of claim 1, wherein at least one corner of the second insulating layer is arcuate from a top view.

3. The semiconductor die of claim 1, wherein the first insulating layer is disposed on the first surface and the side surface of the semiconductor body, and an area of the second insulating layer is smaller than an area of the first insulating layer from a top view.

4. The semiconductor die of claim 3, wherein there is a gap between a side surface of the second insulating layer and a side surface of the first insulating layer.

5. The semiconductor die of claim 4, wherein the gap extends around a periphery of the semiconductor die.

6. The semiconductor die of claim 5, wherein a width of the gap varies around the periphery of the semiconductor die.

7. The semiconductor die of claim 1, wherein the conductive circuit layer further comprises a patterned circuit layer and at least one conductive via, the patterned circuit layer comprises the pad, and the conductive via connects the patterned circuit layer and the first surface of the semiconductor body.

8. A semiconductor wafer, comprising:
    a semiconductor body defining at least one trench recessed from a first surface of the semiconductor body;
    an insulating layer disposed on the first surface of the semiconductor body and on a side surface of the trench, the insulating layer defining at least one groove in the trench, and wherein the insulating layer includes a step structure;
    a conductive circuit layer electrically connected to the first surface of the semiconductor body, the conductive circuit layer comprising at least one pad; and
    at least one conductive bump electrically connected to a respective one of the at least one pad.

9. The semiconductor wafer of claim 8, wherein the trench does not penetrate through the semiconductor body.

10. The semiconductor wafer of claim 8, wherein a bottom surface of the trench is exposed from the insulating layer.

11. The semiconductor wafer of claim 8, wherein the insulating layer comprises a first insulating layer and a second insulating layer disposed over the first insulating layer, wherein at least one corner of the second insulating layer is arcuate from a top view.

12. The semiconductor wafer of claim 8, wherein the insulating layer further defines a trough over the groove, and a width of the trough is greater than a width of the groove.

13. The semiconductor wafer of claim 12, wherein the insulating layer comprises a first insulating layer and a second insulating layer, the first insulating layer is disposed on the first surface of the semiconductor body and the side surface of the trench and defines the groove in the trench; the second insulating layer is disposed on the first insulating layer and defines the trough.

14. A semiconductor process, comprising:
    (a) providing a semiconductor body having a first surface and a second surface opposite the first surface;
    (b) forming at least one trench on the first surface of the semiconductor body;
    (c) forming an insulating layer and a conductive circuit layer on the first surface of the semiconductor body, wherein the insulating layer extends onto a side surface of the trench to define at least one groove in the trench, the insulating layer includes a step structure, and the conductive circuit layer is electrically connected to the first surface of the semiconductor body and comprises at least one pad; and
    (d) forming at least one conductive bump to electrically connect to a respective pad.

15. The semiconductor process of claim 14, wherein the trench of (b) is formed by sawing or etching.

16. The semiconductor process of claim 14, wherein (c) comprises:
    (c1) forming a first insulating layer on the first surface of the semiconductor body and the side surface of the trench, wherein the first insulating layer defines the groove in the trench;
    (c2) forming the conductive circuit layer, wherein the conductive circuit layer comprises a patterned circuit layer and at least one conductive via, the patterned circuit layer comprises the pad and is disposed on the first insulating layer, the conductive via is disposed in the first insulating layer to connect the patterned circuit layer and the first surface of the semiconductor body;
    (c3) forming a second insulating layer on the first insulating layer; and
    (c4) forming at least one second opening and at least trough in the second insulating layer, wherein the trough exposes the groove and the second opening exposes the pad, and wherein a width of the trough is greater than a width of the groove.

17. The semiconductor process of claim 16, wherein (c1) comprises:
    (c11) forming the first insulating layer on the first surface of the semiconductor body and filling the trench with the first insulating layer; and
    (c12) removing a portion of the first insulating layer that is disposed in the trench to expose a bottom surface of the trench.

18. The semiconductor process of claim 16, wherein at least one corner of the second insulating layer is arcuate from a top view.

19. The semiconductor process of claim 14, further comprising:
 (e) removing a portion of the semiconductor body from the second surface to form a plurality of individual semiconductor dice.

* * * * *